June 2, 1964 M. FISCHMAN 3,135,877
DELAY GENERATOR HAVING FIRST AND SECOND RESONANT CIRCUITS CONTROLLING DELAY INTERVAL AND PULSE DURATION RESPECTIVELY
Filed March 1, 1962 2 Sheets-Sheet 1

INVENTOR.
MARTIN FISCHMAN
BY
R. J. Frank
ATTORNEY

INVENTOR.
MARTIN FISCHMAN
BY
R. J. Frank
ATTORNEY

United States Patent Office 3,135,877
Patented June 2, 1964

3,135,877

DELAY GENERATOR HAVING FIRST AND SECOND RESONANT CIRCUITS CONTROLLING DELAY INTERVAL AND PULSE DURATION RESPECTIVELY

Martin Fischman, Wantagh, N.Y., assignor to General Telephone and Electronics Laboratories, Inc., a corporation of Delaware Filed Mar. 1, 1962, Ser. No. 176,748
8 Claims. (Cl. 307—88.5)

This invention relates to delay generators.

In many electronic systems, the time interval between two events must be precisely controlled. In a typical application, a voltage pulse corresponding to the first event is coupled to the input of a delay generator and, after a predetermined interval has elapsed, an output pulse corresponding to the second event is produced at the output of the generator. It is highly desirable that such delay generators be extremely stable as well as capable of providing precisely controlled delays.

Accordingly, it is an object of my invention to provide an improved delay generator.

Another object of the invention is to provide a delay generator which is stable, precise, and provides delays which are practically independent of variations in supply voltage and transistor parameters.

Still another object is to provide a delay generator which may be rapidly reset and hence will respond to signals having high repetition rates.

A further object is to provide a delay generator in which the delay may be accurately and easily adjusted between relatively wide limits.

Yet another object is to provide a delay generator in which the ratio of the delay interval to the recovery period is high.

In the present invention, a delay generator is provided in which the delay interval is precisely controlled by a first resonant circuit comprising an initially charged capacitor and a first inductor. The duration of the output pulse is controlled by a second resonant circuit comprising the capacitor and a second inductor.

The first inductor is connected in series with the charged capacitor upon application of an input signal to the generator. This results in a half cycle of sinusoidal current flow through the capacitor at a frequency equal to the resonant frequency of the first resonant circuit. When the current through the capacitor is reduced to zero at the end of the half cycle, switching circuits initiate an output pulse while simultaneously disconnecting the first inductor from the circuit and coupling the second inductor in series with the capacitor. As a result, a sinusoidal current having a frequency equal to the resonant frequency of the second resonant circuit flows through the capacitor and the second inductor. When this current goes to zero, the output pulse is terminated by the switching circuits and the second inductor is disconnected from the circuit. Thus, the first and second resonant circuits control the delay interval and the duration of the output pulse respectively.

In one embodiment of the invention, first, second and third series circuits are provided. The first series circuit comprises the first inductor and a first inductor switch, the second series circuit includes the second inductor and a second inductor switch, and the third series input circuit comprises the capacitor. The three series circuits are connected in parallel.

The first inductor switch is coupled to and controlled by the output of a first bistable switching circuit of a type designed to generate an output pulse when a suitable input signal is applied to a first of its two input terminals and which terminates the output pulse when a suitable signal is applied to its second input terminal. Similarly, the second inductor switch is coupled to, and controlled by, the output of a similar second bistable switching circuit. First and second pulse forming circuits responsive to the current through the capacitor are also provided, the output of the first pulse forming circuit being coupled to the first input of the second bistable switching circuit and the output of the second pulse forming circuit being coupled to the second inputs of the first and second bistable switching circuits.

When an input pulse is applied to the first input terminal of the first bistable switching circuit, the first inductor switch is closed and a sinusoidal current, having a frequency equal to the resonant frequency of the first inductor and the capacitor, triggers the first pulse forming circuit. After a half cycle, the current drops to zero and the first pulse forming circuit applies a pulse to the second bistable switching circuit thereby closing the second inductor switch and producing the delay generator output pulse at the output of the second bistable switching circuit. As the capacitor current reverses direction, it triggers the second pulse forming circuit thereby applying a pulse to the first bistable switching circuit opening the first inductor switch.

During the second half cycle, the frequency of the sinusoidal capacitor current is equal to the resonant frequency of the second inductor and the capacitor. When this current goes to zero, the second pulse forming circuit applies a pulse to the second bistable switching circuit thereby opening the second inductor switch and terminating the output pulse.

The above objects of and the brief introduction to the present invention will be more fully understood and further objects and advantages will become apparent from a study of the following description in connection with the drawings, wherein.

Figure 1:
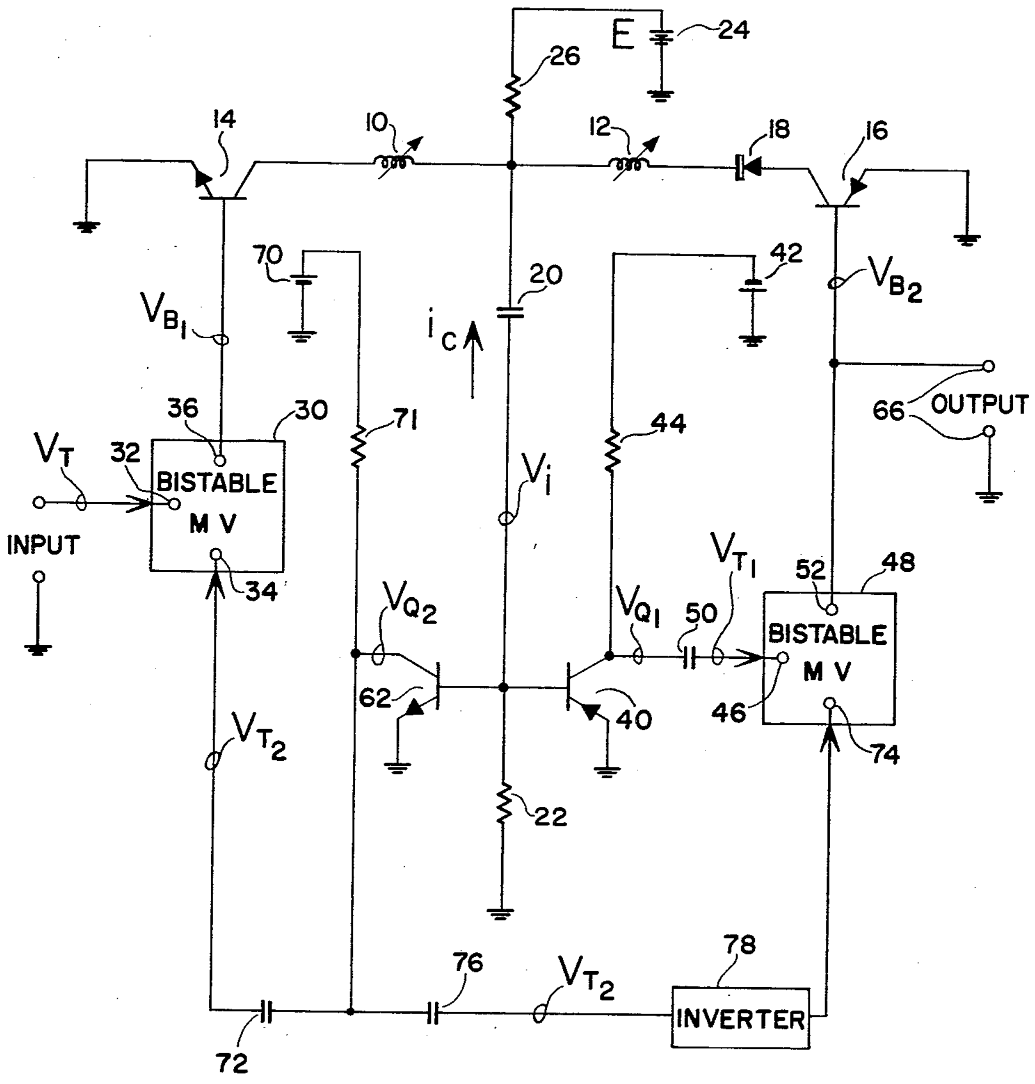
FIG. 1 is a schematic diagram of our delay generator.

Referring to FIG. 1, there is shown a schematic diagram of my delay generator in which first and second variable inductors 10 and 12 are connected in series with first and second inductor switches 14 and 16 respectively. Switch 14 comprises a type NPN transistor having its emitter electrode grounded and its collector electrode connected to inductor 10. Switch 16, which is a type PNP transistor, has its emitter grounded and its collector connected through diode 18 to inductor 12. A capacitor 20, having one end connected to ground through an impedance element or resistor 22 and its other end connected to the junction of inductors 10 and 12, is arranged to be switched in series with either inductor 10 or inductor 12 by switches 14 and 16 respectively to obtain first and second resonant circuits. A D.-C. power source 24 having a magnitude E is coupled through a resistor 26 to the junction of inductors 10 and 12 and capacitor 20.

Figure 2:
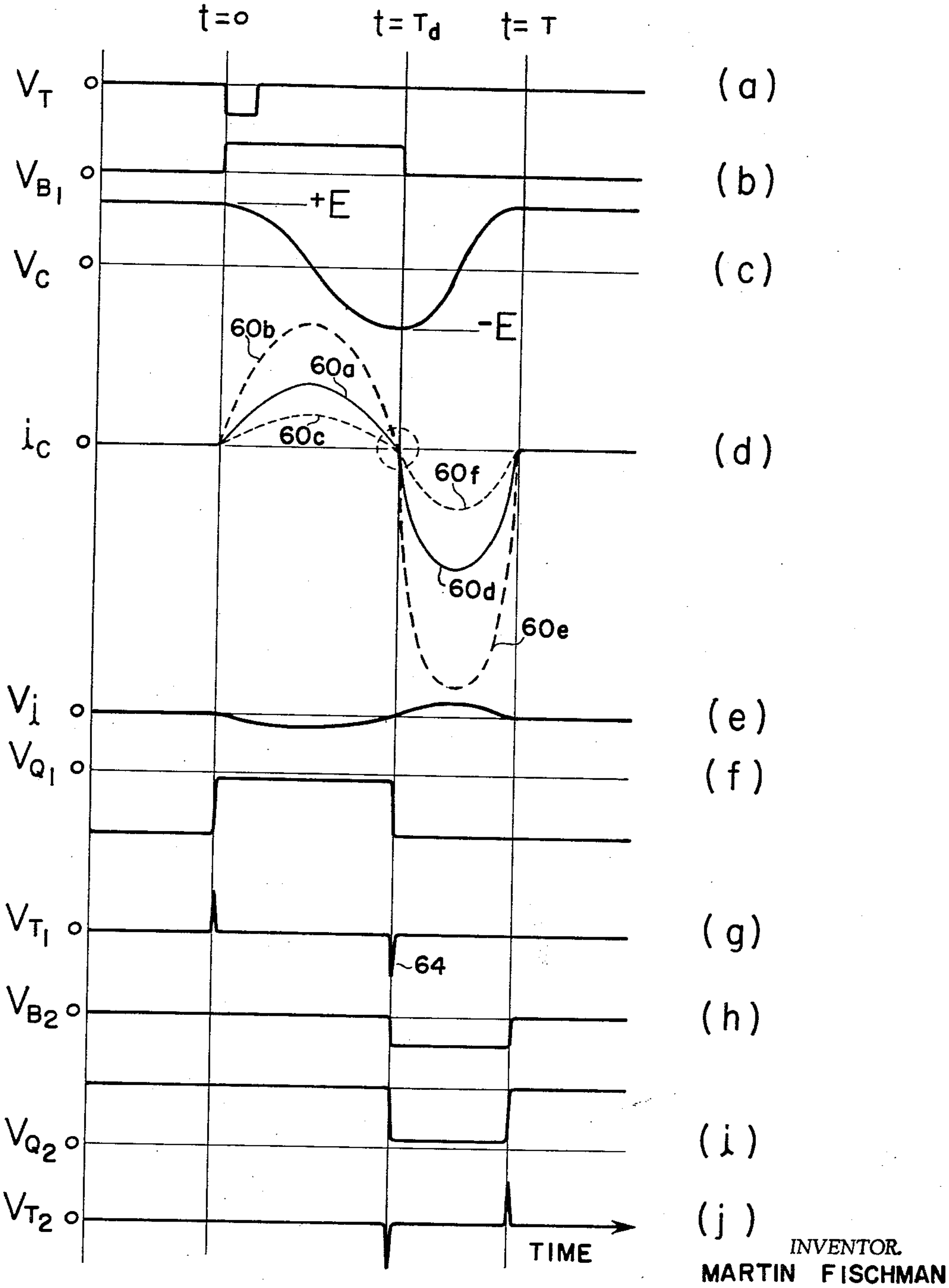
FIG. 2 depicts idealized waveforms of the currents and voltages produced in the delay generator of FIG. 1.

A bistable multivibrator 30, having first and second input terminals 32 and 34 respectively, has its output terminal 36 connected to the base of transistor 14. Multivibrator 30, which may be of any known suitable type such as that illustrated in Fig. 198, page 203 of the Department of the Army Technical Manual TM 11–690, "Basic Theory and Application of Transistors," March 1959, generates a pulse $V_{B1}$ at output terminal 36 when a negative input pulse $V_T$ is applied to terminal 32. These voltage pulses are illustrated in FIGS. 2*b* and 2*a* respectively. When a negative going pulse is applied to terminal 34 of multivibrator 30, the pulse $V_{B1}$ at terminal 36 is terminated. (It shall be understood that when reference is made to the voltage at a terminal or other portion of the circuit, the voltage referred to is measured between the designated point and ground.)

If at a time $t=0$, a negative pulse $V_T$ (see FIG. 2*a*) is applied to terminal 32 of multivibrator 30, a positive pulse $V_{B1}$ (FIG. 2*b*) is applied to the base of type NPN transistor 14 causing it to conduct. Capacitor 20, which has been charged to a voltage +E by voltage source 24 then begins to discharge through inductor 10, the emitter-collector path of transistor 14 and the emitter-base path of a type PNP transistor 40. (Initially, current will flow from ground through resistor 22 driving the base of transistor 40 negative with respect to its emitter causing it to conduct. However, the time required to drive transistor 40 into conduction is so short and the resistance of the base-emitter path of transistor 40 is so low when compared to the value of resistor 22, that the current through resistor 22 is very small. This is indicated by FIG. 2*e* which depicts the voltage $V_i$ across resistor 22.)

The collector of transistor 40 is connected to a negative D.-C. voltage source 42 through a resistor 44 and is coupled to input terminal 46 of bistable multivibrator 48 through a capacitor 50. A positive voltage pulse $V_{Q1}$ (FIG. 2*f*) is produced at the collector of transistor 40 and is differentiated by capacitor 50 and the input resistance of multivibrator 48 resulting in alternate positive and negative voltage spikes $V_{T1}$ as shown in FIG. 2*g*. Multivibrator 48 is identical to multivibrator 30 and therefore it responds only to negative pulses applied to input terminal 46. Thus, the positive spike occurring at $t=0$ in the voltage $V_{T1}$ has no effect on multivibrator 48, the voltage at output terminal 52 being zero during the interval in which transistor 40 is conducting.

The current $i_c$ through capacitor 20 changes sinusoidally during the interval between $t=0$ and $t=T_d$ as indicated by the solid curve 60*a* of FIG. 2*d*, while the voltage across the capacitor $V_c$ (FIG. 2*c*) changes sinusoidally to a value −E. The duration of the delay interval between $t-0$ and $t=T_d$ is equal to $\pi\sqrt{L_1C}$, where $L_1$ is the inductance of the first inductor 10 in henries and C is the capacitance of capacitor 20 in farads. As the current $i_c$ changes direction at $t=T_d$, transistor 40 is cut off and type NPN transistor 62 begins conducting. When transistor 40 ceases to conduct, the drop in the collector voltage $V_{Q1}$ is differentiated producing a negative spike 64 in $V_{T1}$ driving multivibrator 48 into a conducting state and producing an output pulse $V_{B2}$ across output terminals 66. Pulse $V_{B2}$ also drives transistor 16 into conduction connecting inductor 12 in series with capacitor 20.

The collector electrode of transistor 62 is biased by a positive D.-C. voltage source 70 through a resistor 71. When transistor 62 is driven into conduction, its collector is driven negative resulting in the voltage $V_{Q2}$ shown in FIG. 2*i*. This voltage is differentiated by capacitors 72 and 76 and the input resistances of multivibrator 30 and inverter 78 and, as a result, a negative spike $V_{T2}$ (FIG. 2*j*) is applied to input terminal 34 of multivibrator 30. Negative spike $V_{T2}$ cuts off multivibrator 30 and drives transistor 14 out of conduction effectively disconnecting inductor 10 from the circuit. A spike is also applied to input terminal 74 of multivibrator 48 through capacitor 76 and inverter 78. However, due to the polarity reversal occurring in inverter 78, the spike applied to terminal 74 of multivibrator 48 is positive and the multivibrator remains conducting.

Since the delay period $T_d$ is determined by the current $i_c$ through the high Q resonant circuit comprising capacitor 20 and inductor 10, the delay is extremely stable and relatively unaffected by changes in the supply voltage E or variations in the characteristics of the transistor. This is shown in curves 60*b* and 60*c* (FIG. 2*d*) which show the capacitor currents $i_c$ for higher and lower than normal supply voltages E respectively.

During the recovery period between $t=T_d$ and $t=T$, the capacitor current $i_c$ is sinusoidal and flows in a direction opposing the arrow in FIG. 1. The capacitor voltage $V_c$ (FIG. 2*c*) changes sinusoidally from −E to +E during this period as shown in FIG. 2*c*, rectifier 18 preventing current flow in the direction from inductor 12 to transistor 16 during the portion of the recovery period when $V_c$ is positive. The duration of the recovery period between $t=T_d$ and $t=t$ is equal to $\pi\sqrt{L_2C}$, where $L_2$ is the inductance of the second inductor 12. At the end of the recovery period at time $t=T$, the capacitor current $i_c$ goes to zero and transistor 62 becomes non-conducting. The increase in collector voltage $V_{Q2}$ (FIG. 2*i*) is differentiated producing a positive spike $V_{T2}$ at the input of inverter 78. This spike, after inversion, is applied to input terminal 74 of multivibrator 48 cutting it off and reducing the voltage $V_{B2}$ across output terminal 66 to zero. When voltage $V_{B2}$ goes to zero, transistor 16 is cut off restoring the delay generator to its initial condition. A new input pulse may now be applied to terminal 32 of multivibrator 30 and the cycle repeated.

The duration of the output pulse $V_{B2}$ is precisely determined by the resonant frequency of capacitor 20 and second inductor 12 and is relatively independent of changes in supply voltage E. This is shown by the solid curve 60*d* for a normal voltage supply and curves 60*e* and 60*f* for above and below normal supply voltages respectively.

In a typical embodiment of my invention the component and voltage values are as follows:

| | |
|---|---|
| Transistors 14 and 62 | Type 2N1409. |
| Transistors 16 and 40 | Type 2N781. |
| Diode 18 | Type 1N179. |
| Inductor 10 | 3 millihenries. |
| Inductor 12 | 30 microhenries. |
| Capacitor 20 | 0.003 microfarad. |
| Capacitors 50, 72 and 76 | 100 micromicrofarads. |
| Resistors 22, 44 and 71 | 8200 ohms. |
| Resistors 22, 44 and 72 | 3300 ohms. |
| Voltage supplies 24, 42, 70 | 10 volts. |

With these parameters, delays of approximately 10 microseconds and pulse durations of approximately 1 microsecond may be obtained. The delays and durations may be varied over wide limits by suitable choice of the inductive and capacitive elements. The delay period remains within ±.1 percent as the supply voltage 24 is varied from 5 to 15 volts.

As many changes could be made in the above construction and many different embodiments could be made without departing from the scope thereof it is intended that all matter contained in the above description or shown in the accompanying drawings shall be interpreted as illustrative and not in a limiting sense.

What is claimed is:

1. A delay generator comprising (*a*) first, second, and third series circuits, said first series circuit including a first inductor and a first inductor switching means, said second series circuit including a second inductor and a second inductor switching means, and said third series circuit including a capacitor, said first, second, and third series circuits being connected in parallel, (*b*) first and second bistable switching means each having an output terminal and first and second input terminals, the output terminals of said first and second bistable switching means being coupled to the first and second inductor switching means respectively, and (*c*) first and second pulses forming means, said first and second pulse forming means being responsive to the current through said capacitor, the output of said first pulse forming means being coupled to the first input of said second bistable switching means, and the output of said second pulse forming means being coupled to the second inputs of said first and second bistable switching means, an output pulse being produced at the output terminal of said second bistable switching means a predetermined interval after application of an input pulse to the first input terminal of said first bistable switching means, said predetermined interval being determined by the resonant frequency of said capacitor and said first inductor.

2. A delay generator comprising (a) first, second, and third series circuits, said first series circuit including a first inductor and a first inductor switching means, said second series circuit including a second inductor and a second inductor switching means, and said third series circuit including a capacitor and an impedance element, said first, second, and third series circuits being connected in parallel, (b) first and second bistable switching means each having an output terminal and first and second input terminals, the output terminals of said first and second bistable switching means being coupled to the first and second inductor switching means respectively, and (c) first and second pulse forming means each having an input and an output, the inputs of said first and second pulse forming means being coupled to the junction of said capacitor and said impedance element, the output of said first pulse forming means being coupled to the first input of said second bistable switching means, and the output of said second pulse forming means being coupled to the second inputs of said first and second bistable switching means, an output pulse being produced at the output terminal of said second bistable switching means a predetermined interval after application of an input pulse to the first input terminal of said first bistable switching means, said predetermined interval being determined by the resonant frequency of said capacitor and said first inductor.

3. A delay generator comprising (a) first, second, and third series circuits, said first series circuit including a first inductor and a first inductor switching means, said second series circuit including a second inductor and a second inductor switching means, and said third series circuit including a capacitor and a resistor, said first, second, and third series circuits being connected in parallel, (b) first and second bistable multivibrators each having an output terminal and first and second input terminals, the output terminals, of said first and second bistable multivibrators being coupled to the first and second inductor switching means respectively, and (c) first and second pulse forming means each having an input and an output, the inputs of said first and second pulse forming means being coupled to the junction of said capacitor and said resistor, the output of said first pulse forming means being coupled to the first input of said second bistable multivibrator, and the output of said second pulse forming means being coupled to the second inputs of said first and second bistable multivibrators, an output pulse being produced at the output terminal of said second bistable multivibrator a predetermined interval after application of an input pulse to the first input terminal of said first bistable multivibrator, said predetermined interval being determined by the resonant frequency of said capacitor and said first inductor.

4. A delay generator comprising (a) a first series circuit including a first inductor and a first transistor having first, second, and third electrodes, said first inductor being coupled in series with the first and third electrodes of said first transistor, (b) a second series circuit including a second inductor and a second transistor having first, second, and third electrodes, said second inductor being coupled in series with the first and third electrodes of said second transistor, (c) a third series circuit including a capacitor and a resistor, said first, second and third series circuits being connected in parallel, (d) first and second bistable multivibrators each having an output terminal and first and second input terminals, the output terminals of said first and second bistable multivibrators being coupled to the second electrodes of said first and second transistors respectively, and (e) first and second pulse forming means each having an input and an output, the inputs of said first and second pulse forming means being coupled to the junction of said capacitor and said resistor, the output of said first pulse forming means being coupled to the first input of said second bistable multivibrator, and the output of said second pulse forming means being coupled to the second inputs of said first and second bistable multivibrators, an output pulse being produced at the output terminal of said second bistable multivibrator a predetermined interval after application of an input pulse to the first input terminal of said first bistable multivibrator, said predetermined interval being determined by the resonant frequency of said capacitor and said first inductor.

5. The delay generator defined by claim 4 wherein said first transistor is a type NPN and said second transistor is a type PNP, the first, second and third electrodes of said first and second transistor corresponding to emitter, base and collector electrodes respectively.

6. A delay generator comprising (a) a first series circuit including a first inductor and a first transistor having first, second, and third electrodes, said first inductor being coupled in series with the first and third electrodes of said first transistor, (b) a second series circuit including a second inductor and a second transistor having first, second, and third electrodes, said second inductor being coupled in series with the first and third electrodes of said second transistor, (c) a third series circuit including a capacitor and a resistor, said first, second and third series circuits being connected in parallel, (d) first and second bistable multivibrators each having an output terminal and first and second input terminals, the output terminals of said first and second bistable multivibrators being coupled to the second electrodes of said first and second transistors respectively, and (e) third and fourth transistors each having first, second, and third electrodes, the first and second electrodes of said third and fourth transistors being coupled across said resistor, the third electrode of said third transistor being coupled to the first input of said second bistable multivibrator and the third electrode of said fourth transistor being coupled to the second inputs of said first and second bistable multivibrators, an output pulse being produced at the output terminal of said second bistable multivibrator a predetermined interval after application of an input pulse to the first input terminal of said first bistable multivibrator, said predetermined interval being determined by the resonant frequency of said capacitor and said first inductor and the duration of said output pulse being determined by the resonant frequency of said capacitor and said second inductor.

7. A delay generator comprising (a) a first series circuit including a first inductor and a first transistor having first, second, and third electrodes, said first inductor being coupled in series with the first and third electrodes of said first transistor, (b) a second series circuit including a second inductor and a second transistor having first, second, and third electrodes, said second inductor being coupled in series with the first and third electrodes of said second transistor, (c) a third series circuit including a capacitor and a resistor, said first, second and third series circuits being connected in parallel, (d) first and second bistable multivibrators each having an output terminal and first and second input terminals, the output terminals, of said first and second bistable multivibrators being coupled to the second electrode of said first and second transistors respectively, (e) third and fourth transistors each having first, second, and third electrodes, the first and second electrodes of said third and fourth transistors being coupled across said resistor, and (f) first and second differentiating means, said first differentiating means coupling the third electrode of said third transistor to the first input of said second bistable multivibrator and said second differentiating means coupling the third electrode of said fourth transistor to the second inputs of said first and second bistable multivibrators, an output pulse being produced at the output terminal of said second bistable multivibrator a predetermined interval after application of an input pulse to the first input terminal of said bistable multivibrator, said predetermined interval being determined by the resonant frequency of said capacitor and said first inductor and the duration of said output pulse being determined by the resonant frequency of said capacitor and said second inductor.

8. A delay generator as defined by claim 7 wherein said first and third transistors are type NPN and said second and fourth transistors are type PNP, the first, second and third electrodes of said first, second, third and fourth transistors corresponding to the emitter, base and collector electrodes respectively.

References Cited in the file of this patent

UNITED STATES PATENTS 2,847,159 Curtis ---------------- Aug. 12, 1958